United States Patent
Murray, Jr. et al.

(10) Patent No.: US 6,273,327 B1
(45) Date of Patent: Aug. 14, 2001

(54) APPARATUS AND METHOD FOR DEPOSITING SOLDER MATERIAL ONTO A CIRCUIT BOARD

(75) Inventors: Neil Gordon Murray, Jr., Wixom; Geoffrey A. Wright, Clarkston, both of MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/334,373

(22) Filed: Jun. 16, 1999

(51) Int. Cl.[7] ............... B23K 1/20; B23K 31/02
(52) U.S. Cl. ............ 228/245; 228/180.1; 228/214
(58) Field of Search .................... 228/39, 123.1, 228/179.1, 214, 245, 180.1; 438/26, 51, 55, 64, 106; 427/96; 29/827

(56) References Cited

U.S. PATENT DOCUMENTS

| | | | |
|---|---|---|---|
| 4,919,970 | * | 4/1990 | Hoebener et al. ............ 427/96 |
| 5,189,261 | * | 2/1993 | Alexander et al. ........... 174/263 |
| 5,615,477 | * | 4/1997 | Sweitzer ...................... 29/840 |
| 5,668,699 | * | 9/1997 | Bell et al. ..................... 361/753 |
| 5,922,496 | * | 7/1999 | Dalal et al. ................... 430/5 |
| 5,930,601 | * | 7/1999 | Cannizzro et al. ........... 438/122 |
| 5,941,444 | * | 8/1999 | Sadler et al. ................. 228/33 |
| 5,953,589 | * | 9/1999 | Shim et al. ................... 438/106 |

* cited by examiner

*Primary Examiner*—Tom Dunn
*Assistant Examiner*—Colleen P. Cooke
(74) *Attorney, Agent, or Firm*—Tarolli, Sundheim, Covell, Tummino & Szabo L.L.P.

(57) ABSTRACT

A stencil (34) facilitates application of solder material (48) to a circuit board (10) carrying a through-hole component (14, 16, 18, 20, 22) and to which a surface mount component is to be mounted. The stencil (34) has a first surface (38) and a second surface (40). The second surface (40) is engageable to a surface (28) of the circuit board (10) having a plurality of electrically conductive pads (30, 32). At least one first aperture (42) is formed between the first and second surfaces (38, 40) of the stencil (34). The stencil (34) has a first thickness (T1) adjacent the first aperture (42) for depositing a first amount of solder material (48) within the first aperture (42) and around a component lead (24) extending from the through-hole component (14, 16, 18, 20, 22) into the first aperture (42). At least one second aperture (44) is formed between the first and second surfaces (38, 40) of the stencil (34). The stencil (34) has a second thickness (T2), which is less than the first thickness (T1), adjacent the second aperture for depositing a second amount of solder material (48) within the second aperture (44) onto a desired surface mount pad (32) of the circuit board (10).

3 Claims, 2 Drawing Sheets

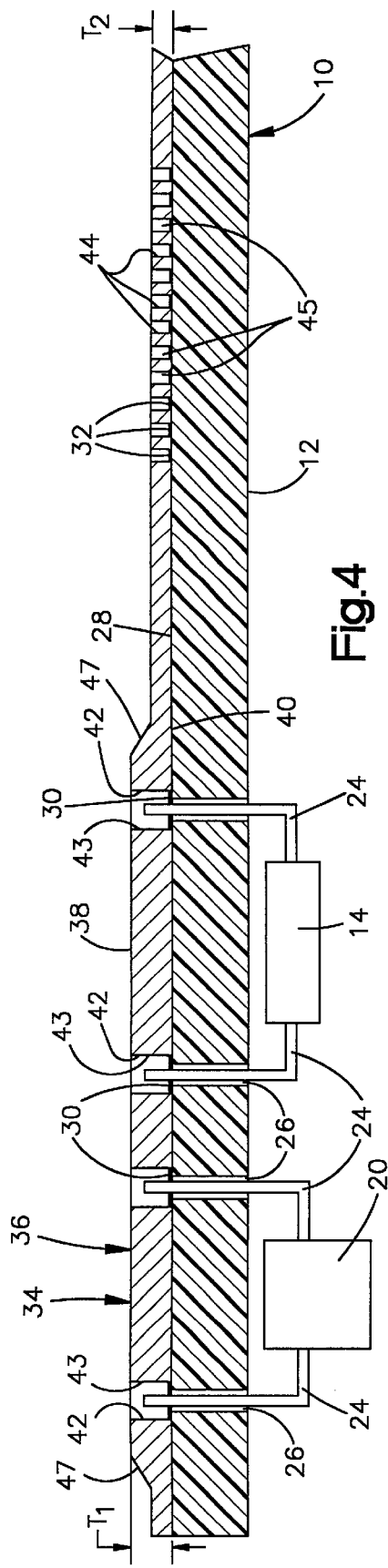
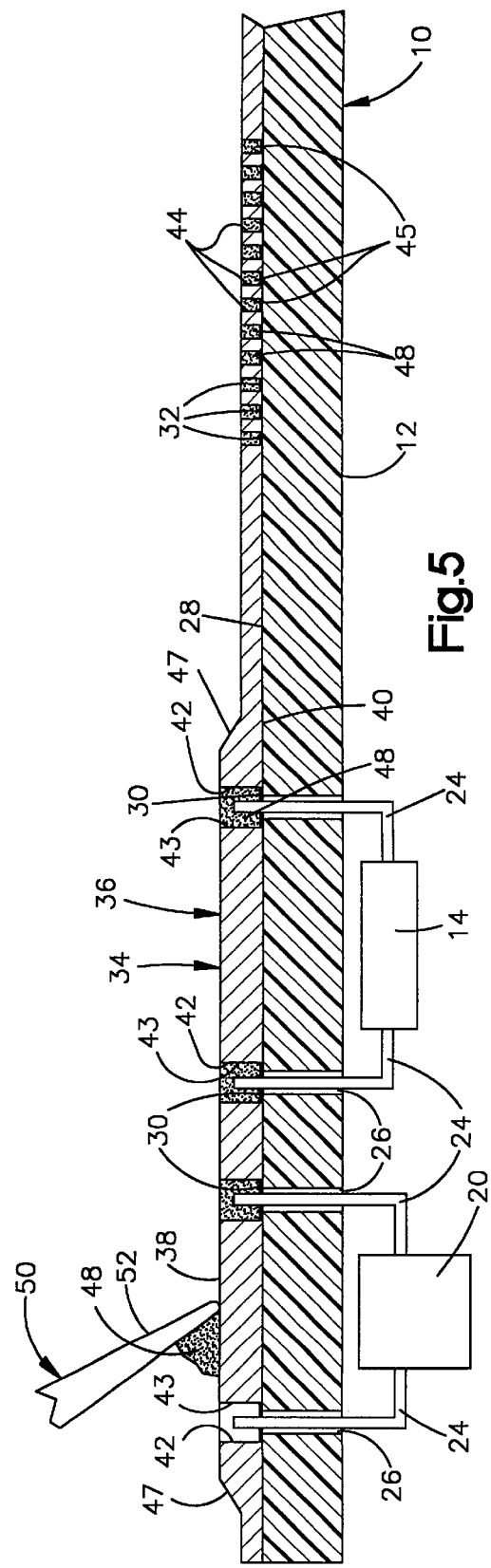

APPARATUS AND METHOD FOR DEPOSITING SOLDER MATERIAL ONTO A CIRCUIT BOARD

TECHNICAL FIELD

The present invention relates to electronic circuit board manufacturing and, more particularly, to an apparatus and method for depositing solder material onto a circuit board.

BACKGROUND OF THE INVENTION

Most electronic devices or modules include both through-hole components and surface mounted components attached to a printed circuit board. The components typically are attached to the circuit board by solder or an electrically conductive adhesive. Soldering may occur manually or by other techniques, including reflow soldering and wave soldering.

When manufacturing large quantities of electronic circuits, solder material usually is applied to electrically conductive pads of the circuit board during one or more solder paste printing process steps. The printing process occurs by applying the solder paste through an appropriately configured stencil or mask. The stencil is configured to have apertures formed through the stencil at locations corresponding to the conductive pads of the circuit board where solder is to be deposited. The stencil is positioned over the circuit board and the solder paste is applied to the circuit board in a known manner.

For example, U.S. Pat. No. 4,739,919 discloses a mask for shielding surface mounted components during a wave-soldering process. In this way, surface mounted components are protected while the leads of selected through-hole circuit components may be soldered to the circuit board.

U.S. Pat. No. 5,593,080 to Teshimi et al. discloses a mask of varying thickness for depositing varying amounts of solder onto differently sized pads of a circuit board.

U.S. Pat. No. 5,617,990 to Thompson, Sr., discloses a shield for use in a wave-soldering process. The shield has solder flow openings formed through the shield for applying solder to the circuit board. Recesses also are formed in the shield to cover and protect selected electronic components during the soldering process.

SUMMARY OF THE INVENTION

The present invention is directed to a stencil for applying solder material to a circuit board carrying a through-hole component and to which a surface mount component is to be mounted. The stencil comprises a plate having a first surface and a second surface. The second surface of the plate is engageable to a surface of the circuit board having a plurality of electrically conductive pads. At least one first aperture is formed between the first to the second surfaces of the plate. The plate has a first thickness adjacent the first aperture for depositing a first amount of solder material within the first aperture around part of a component lead that extends from the through-hole component into the first aperture. At least one second aperture also is formed between the first to the second surfaces of the plate. The plate has a second thickness, which is less than the first thickness, adjacent the second aperture for depositing a second amount of solder material within the second aperture at a desired surface mount pad location on the circuit board. The stencil thus enables predetermined amounts of solder material to be deposited around the component lead of the through-hole component and at the desired surface mount pad location.

BRIEF DESCRIPTION OF THE DRAWINGS

The foregoing and other features and advantages of the present invention will become apparent to those skilled in the art to which the present invention relates upon reading the following description with reference to the accompanying drawings, wherein:

FIG. 4 is a side sectional view of the combination of FIG. 3 taken along line 4—4; and FIG. 5 is a side sectional view, similar to FIG. 4, illustrating application of solder material.

DESCRIPTION OF A PREFERRED EMBODIMENT

Figure 1:
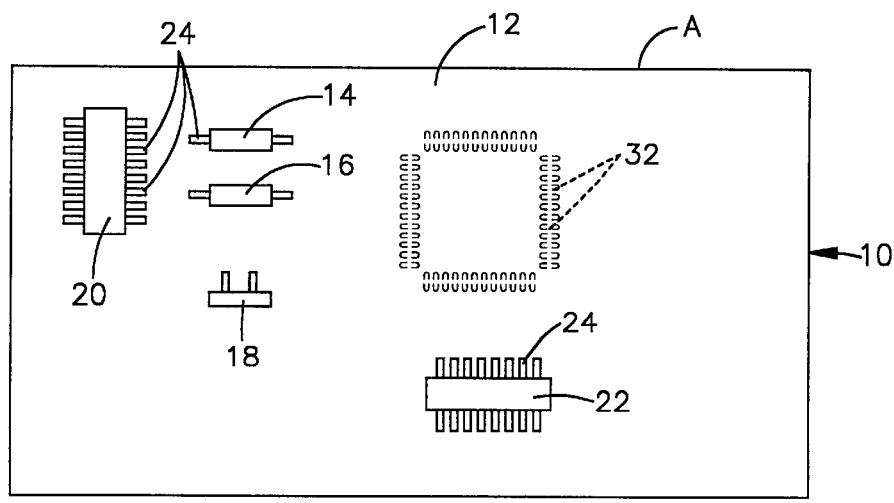
FIG. 1 is a top elevation view of a circuit board.
Figure 2:
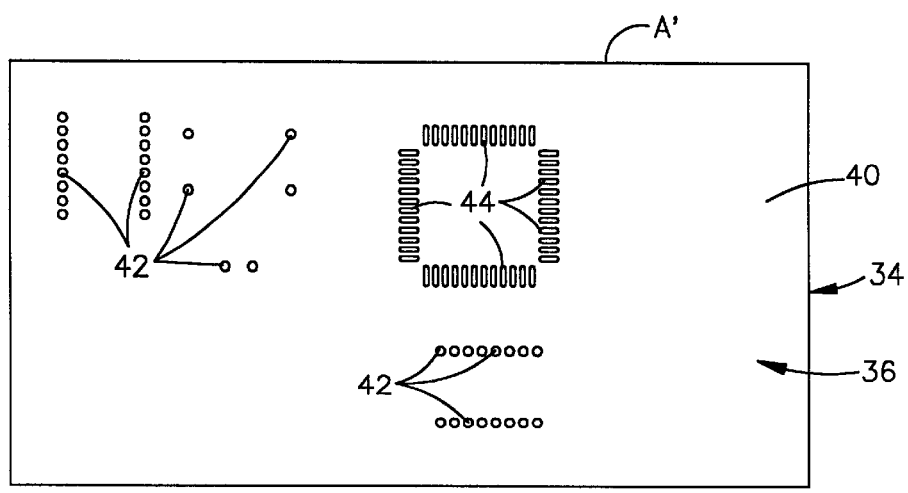
FIG. 2 is a bottom elevation view of a stencil in accordance with the present invention.

FIG. 1 illustrates a substantially planar printed circuit board 10 carrying at least one, and typically a plurality of through-hole circuit components located adjacent a first or front surface 12 of the circuit board 10. The through-hole components, for example, may include resistors 14 and 16, a capacitor 18, integrated circuits 20 and 22, as well as any other type of circuit component, connector, or circuit module.

Referring to FIGS. 1–5, each through-hole circuit component 14–22 has electrically conductive component leads, indicated at 24. Each of the component leads 24 extends from an associated component 14–22 and through corresponding lead holes 26 formed through the circuit board 10, shown in FIGS. 4 and 5. The component leads 24 preferably extend a predetermined distance beyond a second or back surface 28 of the circuit board 10. The component leads 24, for example, may be cut to a desired length manually or by a suitable cutting device of a screen printer assembly.

The circuit board 10 has a circuit footprint that includes a plurality of electrically conductive pads 30 and 32 disposed at predetermined locations of the on the back or second surface 28 of the circuit board 10. The conductive pads 30 and 32 are electrically connected via circuit traces to other pads or terminals of the circuit board 10 to define the circuit footprint.

Each of a first plurality of the conductive pads surrounds an associated lead hole 26. These conductive pads 30 are for electrically connecting to the component leads 24 of the through-hole components 14–22. A small amount of solder bonds and electrically connects each pad 30 to its associated lead.

A second plurality of the electrically conductive pads 32 are surface mount pads for bonding and electrically connecting to corresponding terminal leads of one or more surface mount components, such as an integrated circuit or microprocessor. Prior to attaching a surface mount component to the circuit board 10, such as through wave or reflow soldering, an appropriate amount of solder material must be deposited onto each surface mount pad 32.

In a conventional circuit board manufacturing process, for example, solder material is screen printed onto the surface mount pads 32. The components leads 24 of the through-hole components 14–22 usually are soldered to corresponding pads 30 during a separate process step. This is because the component leads 24 of the through-hole components 14–22 interfere with the screen printing of the solder material onto the surface mount pads 32.

Figure 3:
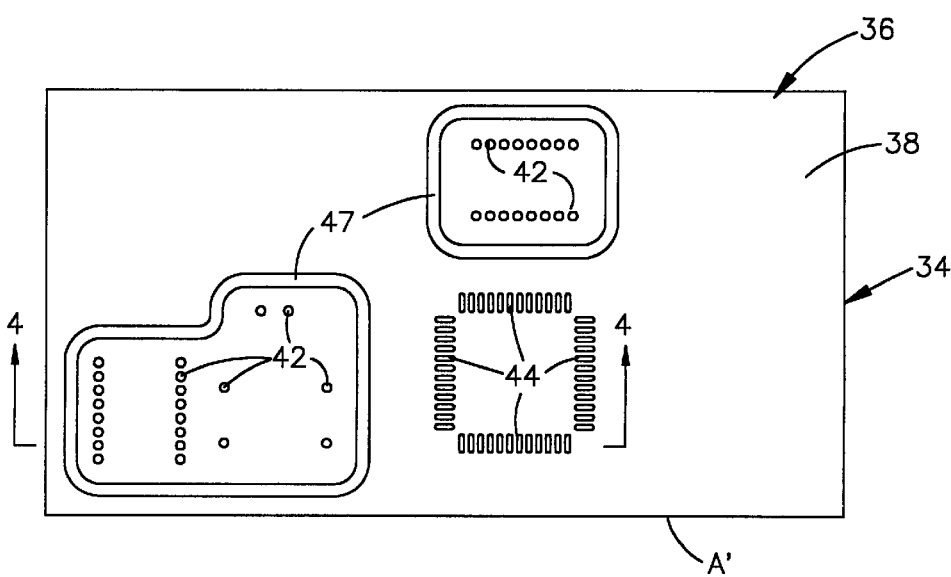
FIG. 3 illustrates a combination of the stencil of FIG. 2 positioned over the circuit board of FIG. 1.

FIGS. 2–5 illustrate a stencil or mask 34 configured, in accordance with the present invention, to permit application of solder at surface mount pads 32 and around component leads 24 of through-hole components 14–22 in a single process step. The stencil 34 is formed of a plate 36 having a first or upper surface 38 spaced from a second or lower surface 40. The second surface 40 of the plate 36 is configured to be engageable to the second surface 28 of the circuit board 10. Preferably, the second surface 40 is substantially planar as is the second surface 28 of the circuit board 10. The edge A of the circuit board 10 (FIG. 1) and edge A' of the stencil 34 (FIG. 2) align when the stencil is placed over the back side 28 of the circuit board 10 (FIG. 3). FIG. 3 shows the upper surface 38 side of the stencil 34 with edge A' positioned at the bottom of the figure and aligned with edge A of the circuit board 10.

A plurality of first apertures 42 and a plurality of second apertures 44 are formed through the plate 36. The apertures 42 and 44 align with corresponding electrically conductive pads 30 and 32, respectively, on the circuit board 10. Each of the first apertures 42 has a sidewall portion 43 extending between the first and second surfaces 38 and 40 of the plate 36. Each of the second apertures 44 has a sidewall portion 45 extending between the first and second surfaces 38 and 40 of the plate 36. Each sidewall portion 43, 45 is configured to have a cross-sectional shape according to the shape of each corresponding conductive pad 30, 32 with which each associated aperture 42, 44 aligns. For example, some sidewall portions 43 may have substantially circular cross-sections whereas other sidewall portions 45 have generally rectangular cross-sections Referring to FIGS. 4 and 5, the depth of each aperture 42, 44 is defined by the thickness of the plate 36 at each of the respective sidewall portions 43, 45. In particular, the plate 36 has, in accordance with one embodiment of the present invention, a first thickness, indicated at T1, near the sidewall portion 43 of each first aperture 42. The plate 36 also has a second thickness, indicated at T2, near the sidewall portion 45 of each of the second apertures 44. Preferably, the first surface 38 of the plate 36 has a tapered portion 47 that extends between adjacent regions of the plate having the first and second thicknesses T1 and T2. The tapered portion 47 gradually tapers, either linearly or arcuately, so that the distance between the first and second surfaces 38 and 40 decreases from the first thickness T1 to the second thickness T2.

The dimensions of the apertures 42, 44 are selected to enable predetermined amounts of solder material to be deposited within each of apertures 42, 44 and onto their associated conductive pads 30, 32.

The plate thickness T2 near the second apertures 44 preferably is much less than the thickness T1 near the first apertures 42. This is because a considerably lesser amount of solder material is needed at surface mount pads 32 to electrically attach surface mount components than is needed to attach through-hole components 14–22 to pads 30. For example, in accordance with one specific embodiment of the present invention, the thickness T1 near the first apertures 42 is about 0,030 inches and the thickness T2 near the surface mount apertures 44 is about 0,008 inches.

The plate 36 preferably is formed of a metal, such as stainless steel or aluminum, although other materials, including a polymer or a suitable resin material, also may be used. The plate 36 may be chemically milled, laser machined, or mechanically machined to selected thicknesses to accommodate application of desired amounts of solder material at specific locations onto the circuit board 10.

Referring to FIGS. 3–5, the formed stencil 34 is mounted over the circuit board 10 so that the second surface 40 of the plate 36 engages the second surface 28 of the circuit board. The stencil 34 may be aligned and positioned relative to the circuit board 10 manually. Alternatively, the stencil 34 may be positioned relative to the circuit board 10 with an appropriate mounting frame of a screen printing assembly.

Another mask, a connecting device, or an adhesive material (not shown) may be used to maintain the relative position between the through-hole components 14–22 and the first surface 12 of the circuit board 10 prior to and during the soldering process. Alternatively, the lead holes 26 may be dimensioned to grip the component leads 24 and maintain their position relative to the circuit board 10 prior to and during the soldering process.

As shown in FIGS. 4 and 5, the component leads 24 of the circuit components 14 and 20 extend through the circuit board 10 beyond the second surface 28 of the circuit board to a location within each of the first apertures 42. Preferably, each of the component leads 24 extends along a central axis of the associated aperture 42 substantially perpendicular to the planar second surface 40 of the plate 36. The leads 24 further terminate at a location intermediate first and second surfaces 38 and 40 of the plate 36.

After the plate 36 has been positioned relative the circuit board 10 so that the plurality of apertures 42, 44 align with corresponding conductive pads 30, 32, solder material 48 is urged into each of the apertures (FIG. 5). The solder material 48 preferably is a solder paste formed of a known combination of solder and solder flux. During application of the solder material 48, preferably with a screen printing assembly, the solder material is maintained at an appropriate temperature selected to provide a desired level of viscosity. This facilitates the flow of the solder material 48 into the apertures 42, 44 and into engagement with the associated conductive pads 30, 32.

The solder material 48 is deposited within the first apertures 42 so that a predetermined amount of solder material surrounds each of the component leads 24 and engages each of the associated conductive pads 30 and associated leads 24. A second, lesser predetermined amount of the solder material 48 also is urged into each of the second apertures 44 so that the solder material engages the conductive pads 32 at the surface mount pad locations.

The solder material 48 conveniently is urged into each of the apertures 42, 44 and onto corresponding conductive pads 30, 32 with a squeegee 50. The squeegee 50, for example, has a blade 52 made of a flexible material, such as a hydrometer rubber, stainless steel, or another material capable of urging the solder material 48 within the apertures 42, 44. An operator wipes the solder material 48 with the squeegee 50 across the first surface 38 of the plate 36 and into and over the apertures 42, 44. The solder material 48 fills each aperture 42, 44 and engages corresponding conductive pads 30, 32. The tapered portions 47 enable the squeegee 50 to easily traverse the first surface 38 of the plate so that the squeegee, in turn, can guide the solder material 48 into the corresponding apertures.

After the solder material 48 is applied into each of the apertures 42, 44, the stencil 34 is removed from the circuit board 10. The solder material 48 is then heated, such as, for example, during a convection reflow soldering process. Accordingly, the solder electrically attaches leads 24 to associated conductive pads 42 as well as bonds to surface mount pads 44.

In view of the foregoing, predetermined amounts of the solder material 48 are provided into each of the first and second apertures 42, 44. The solder material 48 deposited in the apertures 42, 44 has a shape, form, and volume defined by the shape and size of each corresponding aperture. Accordingly, a greater amount of solder material 48 is deposited in each of the first apertures 42 around the component leads 24 than is deposited in each of the second apertures 44 at the surface mount pad locations.

The stencil 34, in accordance with the present invention, advantageously permits application of solder material 48 around the conductive leads 24 and at surface mount pads 32 in a single process step. This, in turn, helps to reduces the time and expense associated with the assembly of electrical devices.

From the above description of the invention, those skilled in the art will perceive improvements, changes and modifications. For example, additional apertures, which are dimensioned differently from the apertures 42, 44, also may be formed through the plate 36 in accordance with the present invention. Such additional apertures permit predetermined amounts of solder material to be deposited at selected locations. Such improvements, changes and modifications within the skill of the art are intended to be covered by the appended claims.

What is claimed is:

1. A method for applying solder material to a circuit board configured for receiving both through-hole components and surface mount components, said method comprising the steps of:

mounting at least one through-hole component adjacent a first surface of the circuit board with component leads extending through the circuit board to a location beyond a second surface of the circuit board;

providing a plate having first and second spaced apart surfaces with first and second pluralities of apertures formed through the plate between the first and second surfaces of the plate, the plate having a first thickness between the first and second surfaces at locations near the first plurality of apertures, the plate having a second thickness, which is less than the first thickness at locations spaced from the first plurality of apertures and near a second plurality of apertures;

positioning the first surface of the plate against the second surface of the circuit board so that the first and second pluralities of apertures of the plate align with corresponding electrically conductive pads on the second surface of the circuit board, each of the component leads aligning with and extending into a corresponding one of the first plurality of apertures of the plate so as to extend past the first surface of said plate, the second plurality of apertures being aligned with conductive pads at surface mount locations of the circuit board; and providing solder material into the first and second pluralities of apertures so that solder material deposited within the first plurality of apertures surrounds corresponding component leads and solder material deposited within the second plurality of apertures engages conductive pads at surface mount pad locations.

2. A method as set forth in claim 1 further including the step of:

forming the first surface of the plate such that the first surface of the plate is substantially planar for engagement with the second surface of the circuit board.

3. A method as set forth in claim 2 further including the steps of:

removing the plate from the circuit board;

mounting at least one surface mount component at an appropriate surface mount location on the circuit board; and reflow soldering the at least one through-hole component and the at least one surface mount component to the circuit board.

* * * * *